US007956946B2

(12) United States Patent
Yang et al.

(10) Patent No.: US 7,956,946 B2
(45) Date of Patent: Jun. 7, 2011

(54) FLAT-PANEL DISPLAY HAVING TEST ARCHITECTURE

(75) Inventors: Tsung-Ying Yang, Hsin-Chu (TW); Kao-Hui Su, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 350 days.

(21) Appl. No.: 12/394,023

(22) Filed: Feb. 26, 2009

(65) Prior Publication Data

US 2010/0171520 A1 Jul. 8, 2010

(30) Foreign Application Priority Data

Jan. 7, 2009 (TW) ............................... 98100330 A

(51) Int. Cl.
*G02F 1/1333* (2006.01)
*G02F 1/1345* (2006.01)
*G01R 31/02* (2006.01)

(52) U.S. Cl. ........... 349/40; 349/149; 324/763; 324/770

(58) Field of Classification Search ........................ None
See application file for complete search history.

(56) References Cited

U.S. PATENT DOCUMENTS 5,546,013 A * 8/1996 Ichioka et al. ........... 324/760.02
6,111,621 A * 8/2000 Kim et al. ........................ 349/54
6,825,911 B2 * 11/2004 Lee et al. ...................... 349/192
6,956,396 B2 10/2005 Lai
7,170,311 B2 * 1/2007 Yu et al. ................... 324/760.01
7,781,890 B2 * 8/2010 Pourkeramati et al. ....... 257/754

FOREIGN PATENT DOCUMENTS

TW I299849 8/2008

* cited by examiner

*Primary Examiner* — Tina M Wong
(74) *Attorney, Agent, or Firm* — Winston Hsu; Scott Margo

(57) ABSTRACT

A flat-panel display having simplified test architecture is disclosed for reducing substrate border area. The flat-panel display includes a plurality of data lines, a plurality of gate lines, a plurality of first conductive lines, a plurality of first one-way switching units, a plurality of second one-way switching units, a plurality of control units and a second conductive line. The gate lines are used to deliver gate signals for use in a test. Each first one-way switching unit functions to allow one-way signal transmission from a corresponding first conductive line to a corresponding gate line. Each second one-way switching unit functions to allow one-way signal transmission from a corresponding first conductive line to the second conductive line. The second conductive line is employed to deliver a corresponding gate signal furnished by a corresponding second one-way switching unit. Each control unit controls inputting of test data signals to one corresponding data line.

21 Claims, 7 Drawing Sheets

FLAT-PANEL DISPLAY HAVING TEST ARCHITECTURE

BACKGROUND OF THE INVENTION

1. Field of the Invention

The present invention relates to a flat-panel display having test architecture, and more particularly, to a flat-panel display having simplified test architecture for reducing substrate border area.

2. Description of the Prior Art

Among existing display devices, the flat-panel displays have gained utmost popularity. Furthermore, among the flat-panel displays, the liquid crystal displays (LCDs) are widely applied in various electronic products such as computer monitors, mobile phones, personal digital assistants (PDAs), or flat-panel televisions due to advantages of thin appearance, low power consumption, and low radiation. In general, the liquid crystal display comprises a liquid crystal layer encapsulated between two substrates and a backlight module for providing a backlight source. The operation of a liquid crystal display is featured by varying voltage drops between opposite sides of the liquid crystal layer for twisting the angles of the liquid crystal molecules of the liquid crystal layer so that the transmittance of the liquid crystal layer can be controlled for illustrating images with the aid of the backlight source.

However, because the displays installed in most of the portable electronic devices are small-size flat-panel displays, how to reduce substrate dimension by shrinking border area for devising a small-size flat-panel display has become one of the most important topics nowadays.

SUMMARY OF THE INVENTION

In accordance with an embodiment of the present invention, a flat-panel display having simplified test architecture is disclosed for reducing substrate border area. The flat-panel display comprises a substrate, a plurality of parallel data lines, a plurality of parallel gate lines, a plurality of first conductive lines, a plurality of first one-way switching units, a plurality of second conductive lines, a third conductive line, a plurality of second one-way switching units, and a plurality of control units.

The substrate comprises an image display area and a border area. The data lines and the gate lines are disposed in the image display area of the substrate. The gate lines are substantially crossed with the data lines perpendicularly. The first conductive lines, the first one-way switching units, the second conductive lines, the third conductive line, the second one-way switching units and the control units are disposed in the border area of the substrate. The first conductive lines are employed to deliver a plurality of gate signals required for performing a panel test. Each first one-way switching unit, electrically connected between a corresponding first conductive line and a corresponding gate line, functions to allow one-way signal transmission from the corresponding first conductive line to the corresponding gate line. The second conductive lines are employed to deliver a plurality of test data signals. The third conductive line is employed to deliver one of the gate signals. Each second one-way switching unit, electrically connected between the third conductive line and a corresponding first conductive line, functions to allow one-way signal transmission from the corresponding first conductive line to the third conductive line. Each control unit is employed to control an electrical connection between a corresponding second conductive line and a corresponding data line based on the gate signal delivered by the third conductive line.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, preferred embodiments of the present invention will be described in detail with reference to the accompanying drawings. Here, it is to be noted that the present invention is not limited thereto.

Figure 1:
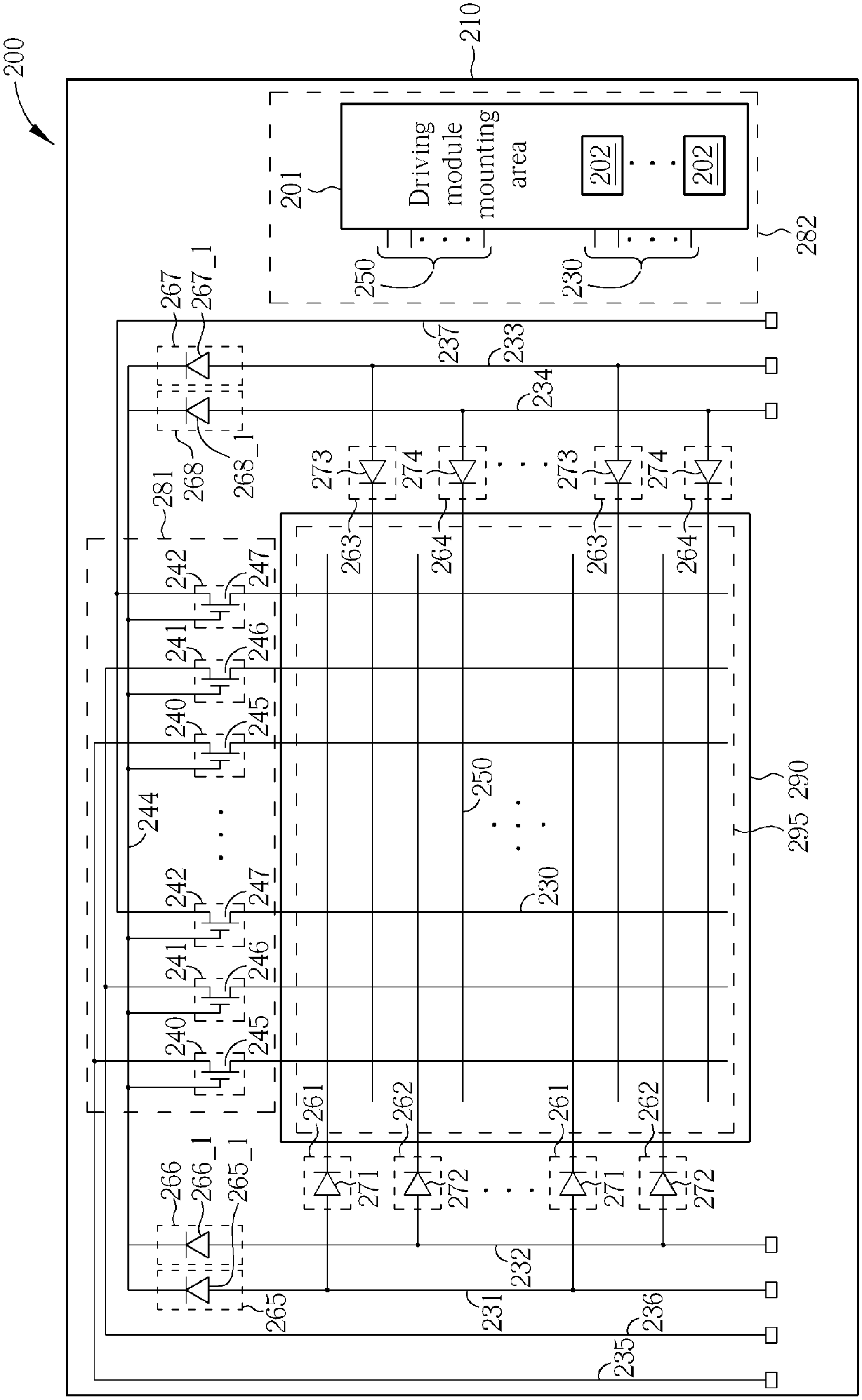
FIG. 1 is a schematic diagram showing the structure of a flat-panel display having test architecture in accordance with a first embodiment of the present invention.

FIG. 1 is a schematic diagram showing the structure of a flat-panel display having test architecture in accordance with a first embodiment of the present invention. As shown in FIG. 1, the flat-panel display 200 comprises a bottom substrate 210, a top substrate 290 positioned on top of the bottom substrate 210, and a liquid crystal layer (not shown) encapsulated between the bottom substrate 210 and the top substrate 290. The top substrate 290 is a color filter employed to display color images. The bottom substrate 210 comprises a plurality of parallel data lines 230, a plurality of parallel gate lines 250, a plurality of first conductive lines 231~234, a plurality of second conductive lines 235~237, a third conductive line 244, a plurality of first one-way switching units 261~264, a plurality of second one-way switching units 265~268, a plurality of control units 240~242, a first region 281, a second region 282, an image display area 295 and a driving module mounting area 201. The gate lines 250 are substantially crossed with the data lines 230 perpendicularly. The first region 281 and the second region 282 are disposed in two adjacent side areas external to the image display area 295. The control units 240~242 and the third conductive line 244 are disposed in the first region 281. The driving module mounting area 201 is disposed in the second region 282. The driving module mounting area 201, electrically connected to the data lines 230 and the gate lines 250, is utilized for installing a driving module thereon so as to provide data signals and gate signals required for displaying images.

The first conductive lines 231~234 and the second conductive lines 235~237 are disposed in two opposite side areas of the bottom substrate 210. Each first one-way switching unit 261, electrically connected between the first conductive line 231 and one corresponding gate line 250, functions to allow one-way signal transmission from the first conductive line 231 to the corresponding gate line 250. Each first one-way switching unit 262, electrically connected between the first conductive line 232 and one corresponding gate line 250, functions to allow one-way signal transmission from the first conductive line 232 to the corresponding gate line 250. Each first one-way switching unit 263, electrically connected between the first conductive line 233 and one corresponding gate line 250, functions to allow one-way signal transmission from the first conductive line 233 to the corresponding gate line 250. Each first one-way switching unit 264, electrically connected between the first conductive line 234 and one corresponding gate line 250, functions to allow one-way signal transmission from the first conductive line 234 to the corresponding gate line 250. Accordingly, as shown in FIG. 1, the odd gate lines 250 are electrically connected to the first one-way switching units 261, 262 based on an interlace arrangement; similarly, the even gate lines 250 are electrically connected to the first one-way switching units 263, 264 based on an interlace arrangement.

The second one-way switching unit 265, electrically connected between the first conductive line 231 and the third conductive line 244, functions to allow one-way signal transmission from the first conductive line 231 to the third conductive line 244. The second one-way switching unit 266, electrically connected between the first conductive line 232 and the third conductive line 244, functions to allow one-way signal transmission from the first conductive line 232 to the third conductive line 244. The second one-way switching unit 267, electrically connected between the first conductive line 233 and the third conductive line 244, functions to allow one-way signal transmission from the first conductive line 233 to the third conductive line 244. The second one-way switching unit 268, electrically connected between the first conductive line 234 and the third conductive line 244, functions to allow one-way signal transmission from the first conductive line 234 to the third conductive line 244.

Each control unit 240, electrically connected to the third conductive line 244, the second conductive line 235 and one corresponding data line 230, is employed to control an electrical connection between the second conductive line 235 and the corresponding data line 230 based on the signal delivered by the third conductive line 244. Each control unit 241, electrically connected to the third conductive line 244, the second conductive line 236 and one corresponding data line 230, is employed to control an electrical connection between the second conductive line 236 and the corresponding data line 230 based on the signal delivered by the third conductive line 244. Each control unit 242, electrically connected to the third conductive line 244, the second conductive line 237 and one corresponding data line 230, is employed to control an electrical connection between the second conductive line 237 and the corresponding data line 230 based on the signal delivered by the third conductive line 244.

The first conductive lines 231~234 are employed to deliver a plurality of gate signals required for performing a panel test. The second conductive lines 235~237 are employed to deliver a plurality of test data signals. For that reason, the signal delivered by the third conductive line 244 is actually one of the gate signals delivered by the first conductive lines 231~234. In other words, the control units 240~242 control the electrical connections between the second conductive lines 235~237 and the data lines 230 based on one corresponding gate signal having high voltage level. For instance, when the gate signal delivered by the first conductive line 233 is an enable signal having high voltage level, the second one-way switching unit 267 is then turned on for passing the gate signal having high voltage level to the third conductive line 244, and therefore the control units 240~242 are enabled for furnishing the test data signals to the data lines 230 so as to perform related color display test on corresponding pixel cells. Alternatively, when the gate signal delivered by the first conductive line 231 is an enable signal having high voltage level, the second one-way switching unit 265 is then turned on for passing the gate signal having high voltage level to the third conductive line 244, and therefore the control units 240~242 are enabled for furnishing the test data signals to the data lines 230 so as to perform related color display test on corresponding pixel cells.

Each first one-way switching unit 261 comprises a diode 271, each first one-way switching unit 262 comprises a diode 272, each first one-way switching unit 263 comprises a diode 273, and each first one-way switching unit 264 comprises a diode 274. The diode 271 comprises a positive end electrically connected to the first conductive line 231 and a negative end electrically connected to a corresponding gate line 250. The diode 272 comprises a positive end electrically connected to the first conductive line 232 and a negative end electrically connected to a corresponding gate line 250. The diode 273 comprises a positive end electrically connected to the first conductive line 233 and a negative end electrically connected to a corresponding gate line 250. The diode 274 comprises a positive end electrically connected to the first conductive line 234 and a negative end electrically connected to a corresponding gate line 250.

The second one-way switching unit 265 comprises a diode 265_1, the second one-way switching unit 266 comprises a diode 266_1, the second one-way switching unit 267 comprises a diode 267_1, and the second one-way switching unit 268 comprises a diode 278_1. The diode 265_1 comprises a positive end electrically connected to the first conductive line 231 and a negative end electrically connected to the third conductive line 244. The diode 266_1 comprises a positive end electrically connected to the first conductive line 232 and a negative end electrically connected to the third conductive line 244. The diode 267_1 comprises a positive end electrically connected to the first conductive line 233 and a negative end electrically connected to the third conductive line 244. The diode 268_1 comprises a positive end electrically connected to the first conductive line 234 and a negative end electrically connected to the third conductive line 244.

Each control unit 240 comprises a transistor 245, each control unit 241 comprises a transistor 246, and each control unit 242 comprises a transistor 247. The transistor 245 comprises a first end electrically connected to the second conductive line 235, a gate end electrically connected to the third conductive line 244, and a second end electrically connected to a corresponding data line 230. The transistor 246 comprises a first end electrically connected to the second conductive line 236, a gate end electrically connected to the third conductive line 244, and a second end electrically connected to a corresponding data line 230. The transistor 247 comprises a first end electrically connected to the second conductive line 237, a gate end electrically connected to the third conductive line 244, and a second end electrically connected to a corresponding data line 230. The transistors 245~247 are thin film transistors, metal oxide semiconductor (MOS) field effect transistors or junction field effect transistors.

In one embodiment, the driving module mounting area 201 comprises at least one driver mounting area 202 for installing at least one driver so as to provide data signals and gate signals to the data lines 230 and the gate lines 250 respectively. In another embodiment, the driving module mounting area 201 comprises a plurality of driver mounting areas 202. The plurality of driver mounting areas 202 comprises at least one source driver mounting area and at least one gate driver mounting area. The source driver mounting area, electrically connected to a plurality of data lines 230, is utilized for installing a source driver so as to provide data signals. The gate driver mounting area, electrically connected to a plurality of gate lines 250, is utilized for installing a gate driver so as to provide gate signals.

Since the signal used by the control units 240~242 for controlling related electrical connections is one of the gate signals delivered by the first conductive lines 231~234, the two opposite side areas of the bottom substrate 210 are not required to dispose the third conductive line 244 for delivering dedicated control signal of the control units 240~242. In other words, the size of the flat-panel display 200 can be reduced significantly by a decrease of the two opposite side areas of the bottom substrate 210. That is, the flat-panel display 200 is particularly suitable for use as a small-size display installed in any portable electronic device.

Figure 2:
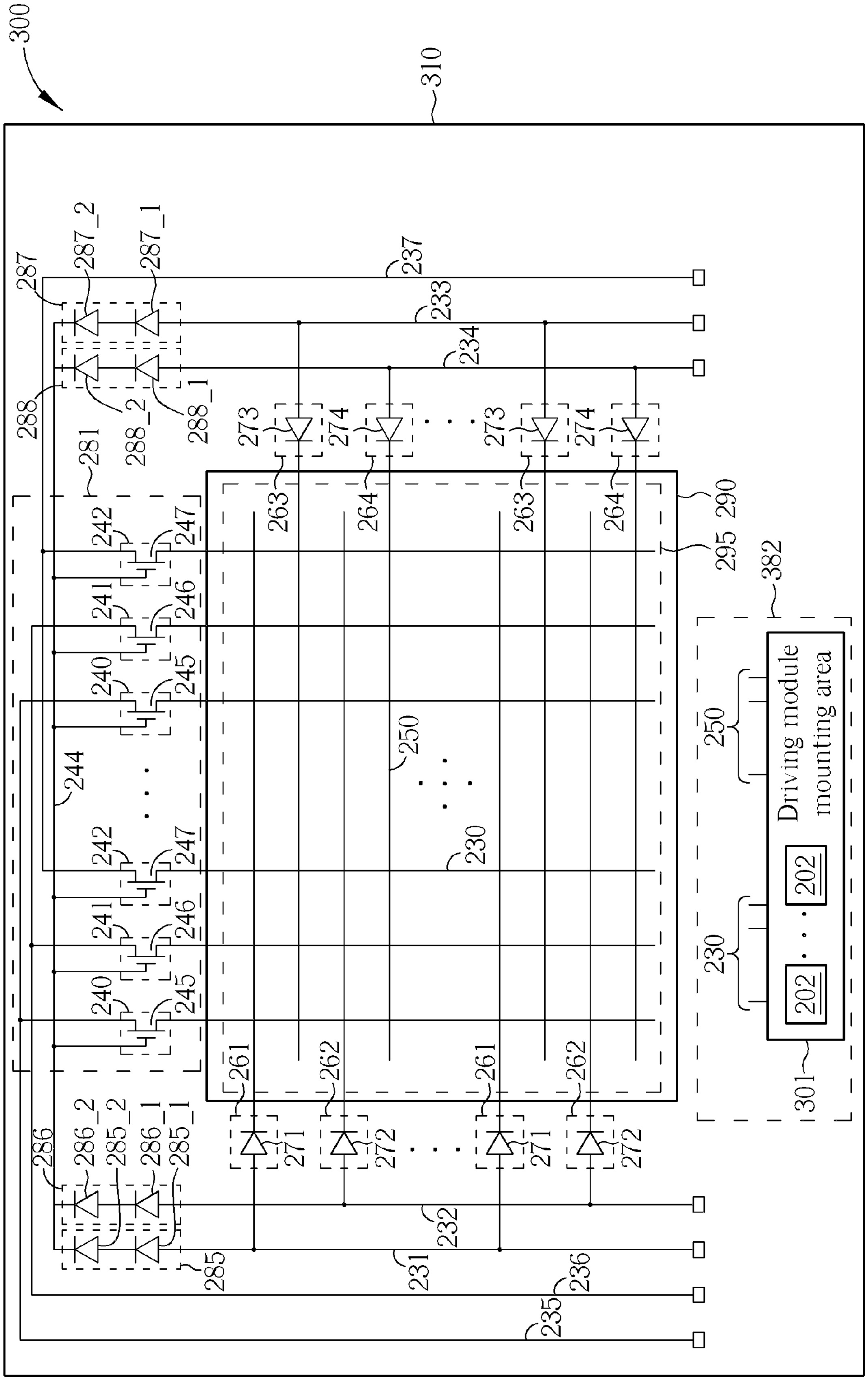
FIG. 2 is a schematic diagram showing the structure of a flat-panel display having test architecture in accordance with a second embodiment of the present invention.

FIG. 2 is a schematic diagram showing the structure of a flat-panel display having test architecture in accordance with a second embodiment of the present invention. As shown in FIG. 2, the flat-panel display 300 comprises a bottom substrate 310, a top substrate 290 positioned on top of the bottom substrate 310, and a liquid crystal layer (not shown) encapsulated between the bottom substrate 310 and the top substrate 290. The structure of the bottom substrate 310 is similar to that of the bottom substrate 210 shown in FIG. 1, differing in that the second one-way switching units 265~268 are replaced with a plurality of second one-way switching units 285~288, the second region 282 is replaced with a second region 382, and the driving module mounting area 201 is replaced with a driving module mounting area 301. The second region 382 is disposed in one side area of the bottom substrate 310 and is opposite to the side area including the first region 281. The driving module mounting area 301 is disposed in the second region 382 and the internal structure thereof is identical to that of the driving module mounting area 201.

The second one-way switching unit 285 comprises two diodes 285_1, 285_2 connected in series. The diode 285_1 comprises a positive end electrically connected to the first conductive line 231 and a negative end electrically connected to the diode 285_2. The diode 285_2 comprises a positive end electrically connected to the negative end of the diode 285_1 and a negative end electrically connected to the third conductive line 244. The second one-way switching unit 286 comprises two diodes 286_1, 286_2 connected in series. The diode 286_1 comprises a positive end electrically connected to the first conductive line 232 and a negative end electrically connected to the diode 286_2. The diode 286_2 comprises a positive end electrically connected to the negative end of the diode 286_1 and a negative end electrically connected to the third conductive line 244. The second one-way switching unit 287 comprises two diodes 287_1, 287_2 connected in series. The diode 287_1 comprises a positive end electrically connected to the first conductive line 233 and a negative end electrically connected to the diode 287_2. The diode 287_2 comprises a positive end electrically connected to the negative end of the diode 287_1 and a negative end electrically connected to the third conductive line 244. The second one-way switching unit 288 comprises two diodes 288_1, 288_2 connected in series. The diode 288_1 comprises a positive end electrically connected to the first conductive line 234 and a negative end electrically connected to the diode 288_2. The diode 288_2 comprises a positive end electrically connected to the negative end of the diode 288_1 and a negative end electrically connected to the third conductive line 244.

Figure 3:
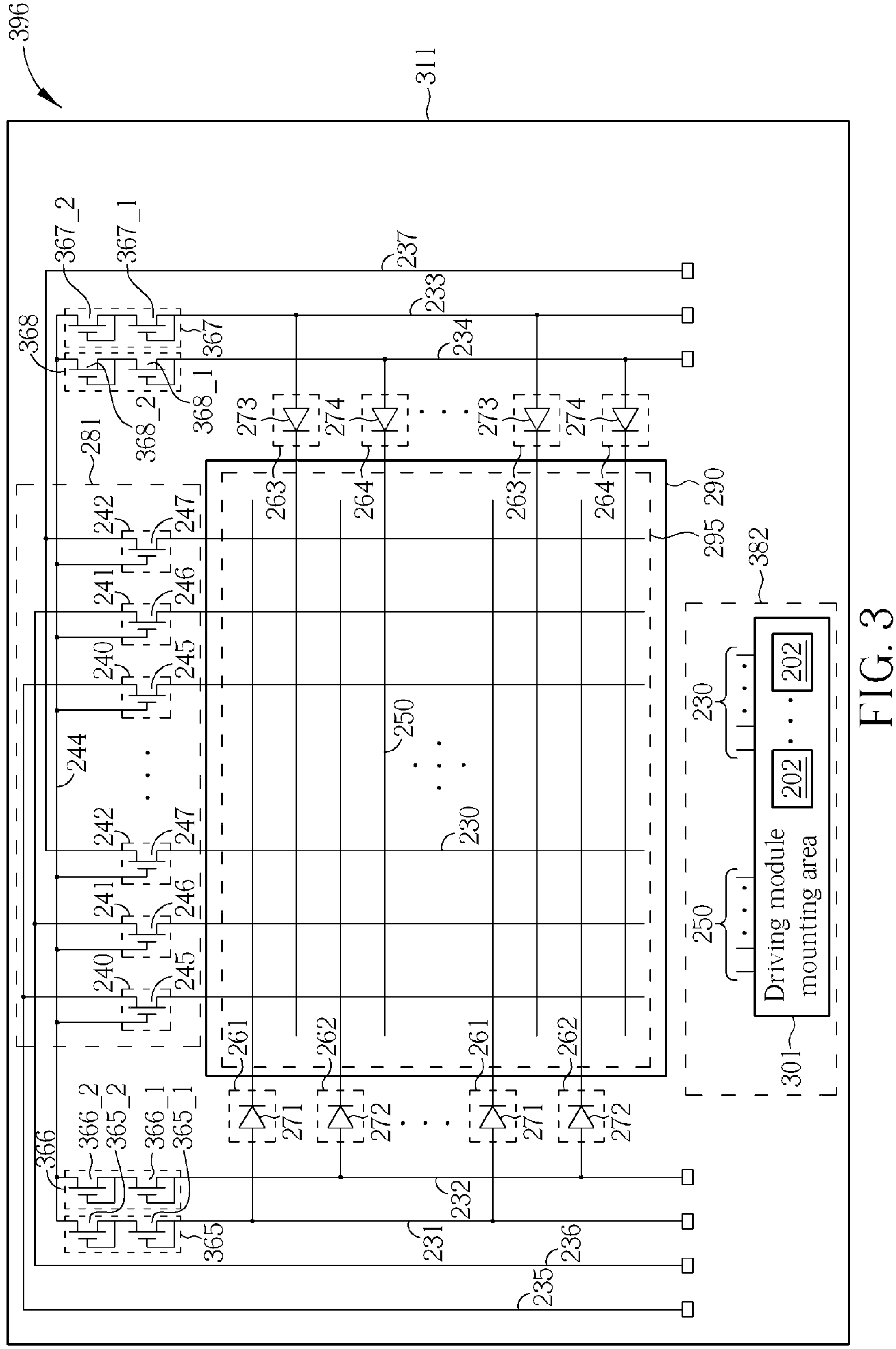
FIG. 3 is a schematic diagram showing the structure of a flat-panel display having test architecture in accordance with a third embodiment of the present invention.

FIG. 3 is a schematic diagram showing the structure of a flat-panel display having test architecture in accordance with a third embodiment of the present invention. As shown in FIG. 3, the flat-panel display 396 comprises a bottom substrate 311, a top substrate 290 positioned on top of the bottom substrate 311, and a liquid crystal layer (not shown) encapsulated between the bottom substrate 311 and the top substrate 290. The structure of the bottom substrate 311 is similar to that of the bottom substrate 310 shown in FIG. 2, differing in that the second one-way switching units 285~288 are replaced with a plurality of second one-way switching units 365~368.

The second one-way switching unit 365 comprises two transistors 365_1, 365_2. The transistor 365_1 comprises a first end electrically connected to the first conductive line 231, a gate end electrically connected to the first end, and a second end electrically connected to the transistor 365_2. The transistor 365_2 comprises a first end electrically connected to the second end of the transistor 365_1, a gate end electrically connected to the first end, and a second end electrically connected to the third conductive line 244. The second one-way switching unit 366 comprises two transistors 366_1, 366_2. The transistor 366_1 comprises a first end electrically connected to the first conductive line 232, a gate end electrically connected to the first end, and a second end electrically connected to the transistor 366_2. The transistor 366_2 comprises a first end electrically connected to the second end of the transistor 366_1, a gate end electrically connected to the first end, and a second end electrically connected to the third conductive line 244.

The second one-way switching unit 367 comprises two transistors 367_1, 367_2. The transistor 367_1 comprises a first end electrically connected to the first conductive line 233, a gate end electrically connected to the first end, and a second end electrically connected to the transistor 367_2. The transistor 367_2 comprises a first end electrically connected to the second end of the transistor 367_1, a gate end electrically connected to the first end, and a second end electrically connected to the third conductive line 244. The second one-way switching unit 368 comprises two transistors 368_1, 368_2. The transistor 368_1 comprises a first end electrically connected to the first conductive line 234, a gate end electrically connected to the first end, and a second end electrically connected to the transistor 368_2. The transistor 368_2 comprises a first end electrically connected to the second end of the transistor 368_1, a gate end electrically connected to the first end, and a second end electrically connected to the third conductive line 244. The transistors 365_1~368_1 and 365_2~368_2 are thin film transistors, MOS field effect transistors, or junction field effect transistors. In another embodiment, the transistors 365_2~368_2 can be omitted, and the second ends of the transistors 365_1~368_1 are electrically connected directly to the third conductive line 244.

Figure 4:
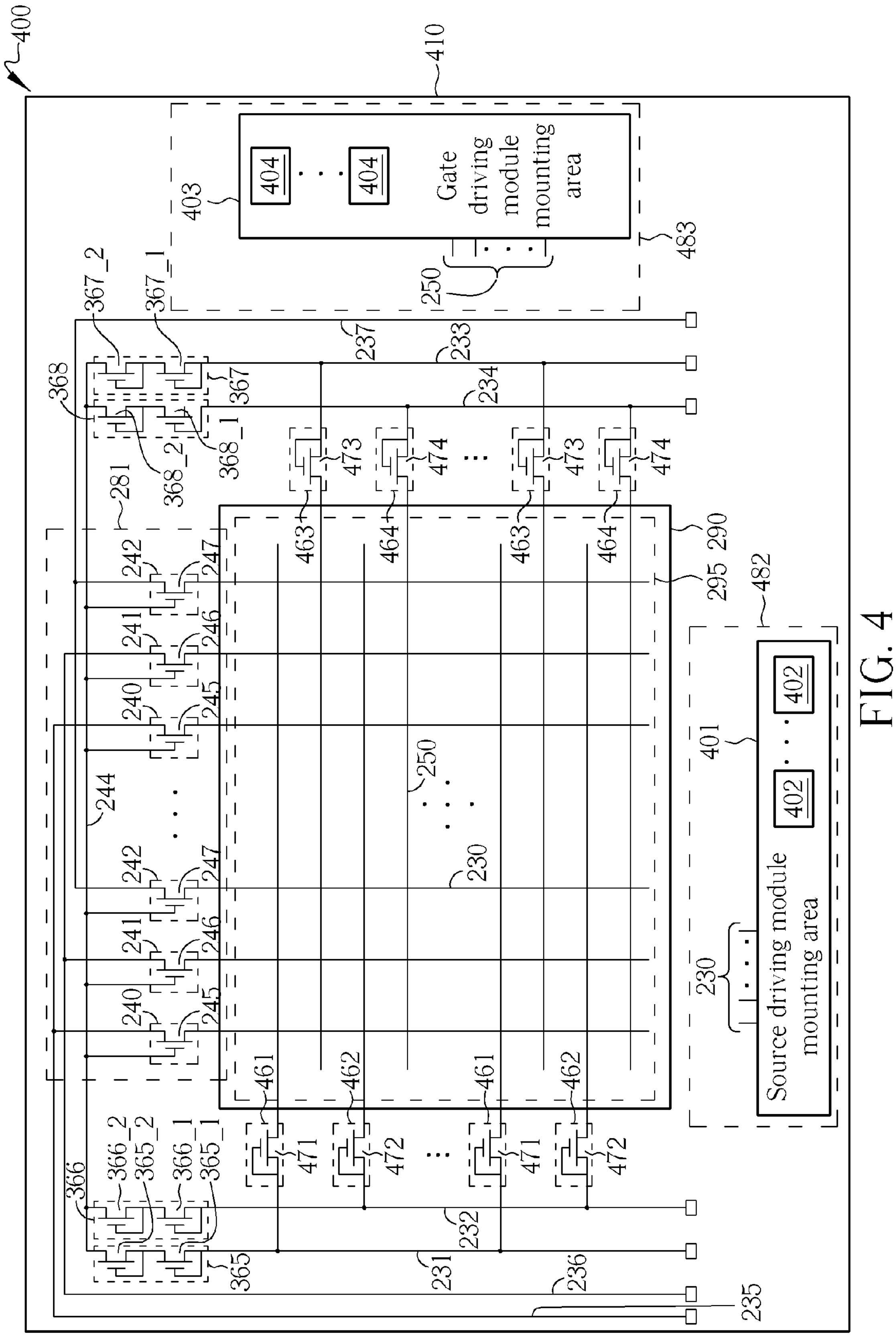
FIG. 4 is a schematic diagram showing the structure of a flat-panel display having test architecture in accordance with a fourth embodiment of the present invention.

FIG. 4 is a schematic diagram showing the structure of a flat-panel display having test architecture in accordance with a fourth embodiment of the present invention. As shown in FIG. 4, the flat-panel display 400 comprises a bottom substrate 410, a top substrate 290 positioned on top of the bottom substrate 410, and a liquid crystal layer (not shown) encapsulated between the bottom substrate 410 and the top substrate 290. The structure of the bottom substrate 410 is similar to that of the bottom substrate 311 shown in FIG. 3, differing in that the first one-way switching units 261~264 are replaced with a plurality of one-way switching units 461~464, the second region 382 is replaced with a second region 482 and a third region 483, and the driving module mounting area 301 is replaced with a source driving module mounting area 401 and a gate driving module mounting area 403. The second region 482 is disposed in one side area of the bottom substrate 410 and is opposite to the side area including the first region 281. The third region 483 is disposed in another side area of the bottom substrate 410 and is adjacent to the side area including the first region 281. The source driving module mounting area 401 is disposed in the second region 482 and the gate driving module mounting area 403 is disposed in the second region 483.

Each first one-way switching unit 461 comprises a transistor 471, each first one-way switching unit 462 comprises a transistor 472, each first one-way switching unit 463 comprises a transistor 473, and each first one-way switching unit 464 comprises a transistor 474. The transistor 471 comprises a first end electrically connected to the first conductive line 231, a gate end electrically connected to the first end, and a second end electrically connected to a corresponding gate line 250. The transistor 472 comprises a first end electrically connected to the first conductive line 232, a gate end electrically connected to the first end, and a second end electrically connected to a corresponding gate line 250. The transistor 473 comprises a first end electrically connected to the first conductive line 233, a gate end electrically connected to the first end, and a second end electrically connected to a corresponding gate line 250. The transistor 474 comprises a first end electrically connected to the first conductive line 234, a gate end electrically connected to the first end, and a second end electrically connected to a corresponding gate line 250. The transistors 471~474 are thin film transistors, MOS field effect transistors, or junction field effect transistors.

The source driving module mounting area 401 is electrically connected to the data lines 230. In one embodiment, the source driving module mounting area 401 comprises at least one source driver mounting area 402 for installing at least one source driver so as to provide data signals to the data lines 230. In another embodiment, the source driving module mounting area 401 comprises a plurality of source driver mounting areas 402. Each source driver mounting areas 402 is electrically connected to a plurality of data lines 230 and is utilized for installing a source driver so as to provide data signals.

The gate driving module mounting area 403 is electrically connected to the gate lines 250. In one embodiment, the gate driving module mounting area 403 comprises at least one gate driver mounting area 404 for installing at least one gate driver so as to provide gate signals to the gate lines 250. In another embodiment, the gate driving module mounting area 403 comprises a plurality of gate driver mounting areas 404. Each gate driver mounting areas 404 is electrically connected to a plurality of gate lines 250 and is utilized for installing a gate driver so as to provide gate signals.

Figure 5:
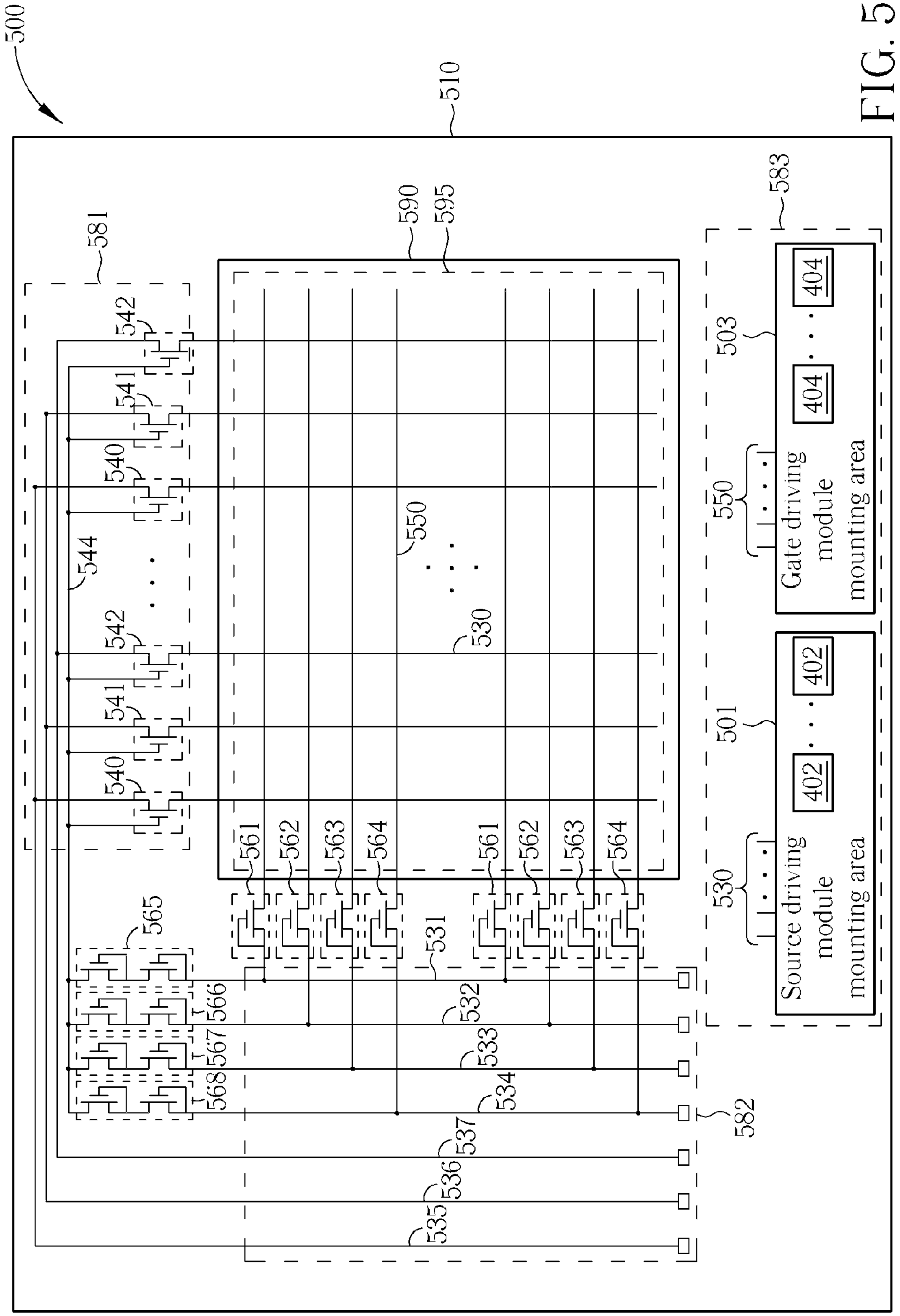
FIG. 5 is a schematic diagram showing the structure of a flat-panel display having test architecture in accordance with a fifth embodiment of the present invention.

FIG. 5 is a schematic diagram showing the structure of a flat-panel display having test architecture in accordance with a fifth embodiment of the present invention. As shown in FIG. 5, the flat-panel display 500 comprises a bottom substrate 510, a top substrate 590 positioned on top of the bottom substrate 510, and a liquid crystal layer (not shown) encapsulated between the bottom substrate 510 and the top substrate 590. The top substrate 590 is a color filter employed to display color images. The bottom substrate 510 comprises a plurality of data lines 530, a plurality of gate lines 550, a plurality of first conductive lines 531~534, a plurality of second conductive lines 535~537, a third conductive line 544, a plurality of first one-way switching units 561~564, a plurality of second one-way switching units 565~568, a plurality of control units 540~542, a first region 581, a second region 582, a third region 583, an image display area 595, a source driving module mounting area 501 and a gate driving module mounting area 503. The first region 581 and the second region 582 are disposed in two adjacent side areas external to the image display area 595. The third region 583 is disposed in another side area opposite to the side area including the first region 581.

The control units 540~542 and the third conductive line 544 are disposed in the first region 581. The first conductive lines 531~534 and the second conductive lines 535~537 are disposed in the second region 582. The source driving module mounting area 501 and the gate driving module mounting area 503 are disposed in the third region 583. The source driving module mounting area 501 is electrically connected to the data lines 530 and is utilized for installing a source driving module so as to provide data signals required for displaying images. The gate driving module mounting area 503 is electrically connected to the gate lines 550 and is utilized for installing a gate driving module so as to provide gate signals required for displaying images. The internal structures of the source driving module mounting area 501 and the gate driving module mounting area 503 are respectively identical to those of the source driving module mounting area 401 and the gate driving module mounting area 403 shown in FIG. 4.

Each first one-way switching unit 561, electrically connected between the first conductive line 531 and one corresponding gate line 550, functions to allow one-way signal transmission from the first conductive line 531 to the corresponding gate line 550. Each first one-way switching unit 562, electrically connected between the first conductive line 532 and one corresponding gate line 550, functions to allow one-way signal transmission from the first conductive line 532 to the corresponding gate line 550. Each first one-way switching unit 563, electrically connected between the first conductive line 533 and one corresponding gate line 550, functions to allow one-way signal transmission from the first conductive line 533 to the corresponding gate line 550. Each first one-way switching unit 564, electrically connected between the first conductive line 534 and one corresponding gate line 550, functions to allow one-way signal transmission from the first conductive line 534 to the corresponding gate line 550. As shown in FIG. 5, the gate lines 550 are electrically connected to the first one-way switching units 561~564 periodically disposed in sequence. The internal structures of the first one-way switching units 561~564 are identical to those of the first one-way switching units 461~464 shown in FIG. 4.

The second one-way switching unit 565, electrically connected between the first conductive line 531 and the third conductive line 544, functions to allow one-way signal transmission from the first conductive line 531 to the third conductive line 544. The second one-way switching unit 566, electrically connected between the first conductive line 532 and the third conductive line 544, functions to allow one-way signal transmission from the first conductive line 532 to the third conductive line 544. The second one-way switching unit 567, electrically connected between the first conductive line 533 and the third conductive line 544, functions to allow one-way signal transmission from the first conductive line 533 to the third conductive line 544. The second one-way switching unit 568, electrically connected between the first conductive line 534 and the third conductive line 544, functions to allow one-way signal transmission from the first conductive line 534 to the third conductive line 544. The internal structures of the second one-way switching units 565~568 are identical to those of the second one-way switching units 365~368 shown in FIG. 3.

Each control unit 540, electrically connected to the third conductive line 544, the second conductive line 535 and one corresponding data line 530, is employed to control an electrical connection between the second conductive line 535 and the corresponding data line 530 based on the signal delivered by the third conductive line 544. Each control unit 541, electrically connected to the third conductive line 544, the second conductive line 536 and one corresponding data line 530, is employed to control an electrical connection between the second conductive line 536 and the corresponding data line 530 based on the signal delivered by the third conductive line 544. Each control unit 542, electrically connected to the third conductive line 544, the second conductive line 537 and one corresponding data line 530, is employed to control an electrical connection between the second conductive line 537 and the corresponding data line 530 based on the signal delivered by the third conductive line 544. The internal structures of the control units 540~542 are identical to those of the control units 240~242 shown in FIG. 1.

The first conductive lines 531~534 are employed to deliver a plurality of gate signals required for performing a panel test. The second conductive lines 535~537 are employed to deliver a plurality of test data signals. For that reason, the signal delivered by the third conductive line 544 is actually one of the gate signals delivered by the first conductive lines 531~534. In other words, the control units 540~542 control the electrical connections between the second conductive lines 535~537 and the data lines 530 based on one corresponding gate signal having high voltage level. Compared with the flat-panel display 400 shown in FIG. 4, the first conductive lines 531~534 and the second conductive lines 535~537 of the flat-panel display 500 are all disposed in one same side area of the bottom substrate 510; furthermore, both the source driving module mounting area 501 and the gate driving module mounting area 503 are disposed in another same side area of the bottom substrate 510.

Figure 6:
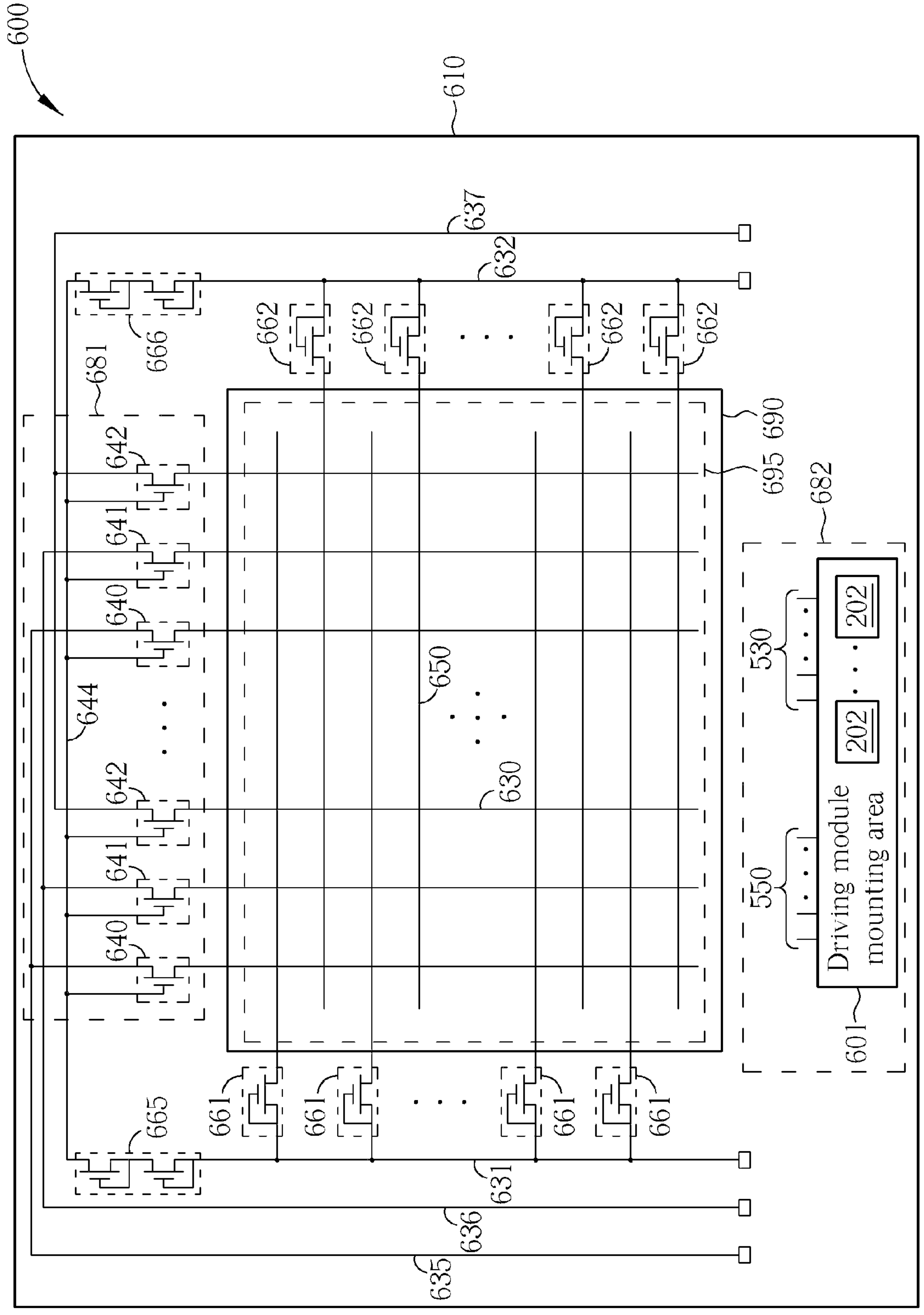
FIG. 6 is a schematic diagram showing the structure of a flat-panel display having test architecture in accordance with a sixth embodiment of the present invention.

FIG. 6 is a schematic diagram showing the structure of a flat-panel display having test architecture in accordance with a sixth embodiment of the present invention. As shown in FIG. 6, the flat-panel display 600 comprises a bottom substrate 610, a top substrate 690 positioned on top of the bottom substrate 610, and a liquid crystal layer (not shown) encapsulated between the bottom substrate 610 and the top substrate 690. The top substrate 690 is a color filter employed to display color images. The bottom substrate 610 comprises a plurality of data lines 630, a plurality of gate lines 650, a plurality of first conductive lines 631~632, a plurality of second conductive lines 635~637, a third conductive line 644, a plurality of first one-way switching units 661~662, a plurality of second one-way switching units 665~666, a plurality of control units 640~642, a first region 681, a second region 682, an image display area 695 and a driving module mounting area 601. The first region 681 and the second region 682 are disposed in two opposite side areas external to the image display area 695. The control units 640~642 and the third conductive line 644 are disposed in the first region 681. The driving module mounting area 601 is disposed in the second region 682. The driving module mounting area 601, electrically connected to the data lines 630 and the gate lines 650, is utilized for installing a driving module so as to provide data signals and gate signals required for displaying images. The internal structure of the driving module mounting area 601 is identical to that of the driving module mounting area 201 shown in FIG. 1.

The first conductive lines 631~632 and the second conductive lines 635~637 are disposed in two opposite side areas of the bottom substrate 610. Each first one-way switching unit 661, electrically connected between the first conductive line 631 and one corresponding odd gate line 650, functions to allow one-way signal transmission from the first conductive line 631 to the corresponding odd gate line 650. Each first one-way switching unit 662, electrically connected between the first conductive line 632 and one corresponding even gate line 650, functions to allow one-way signal transmission from the first conductive line 632 to the corresponding even gate line 650. Accordingly, as shown in FIG. 6, the odd gate lines 650 are electrically connected to the first one-way switching units 661 respectively, and the even gate lines 650 are electrically connected to the first one-way switching units 662 respectively. The second one-way switching unit 665, electrically connected between the first conductive line 631 and the third conductive line 644, functions to allow one-way signal transmission from the first conductive line 631 to the third conductive line 644. The second one-way switching unit 666, electrically connected between the first conductive line 632 and the third conductive line 644, functions to allow one-way signal transmission from the first conductive line 632 to the third conductive line 644.

Each control unit 640, electrically connected to the third conductive line 644, the second conductive line 635 and one corresponding data line 630, is employed to control an electrical connection between the second conductive line 635 and the corresponding data line 630 based on the signal delivered by the third conductive line 644. Each control unit 641, electrically connected to the third conductive line 644, the second conductive line 636 and one corresponding data line 630, is employed to control an electrical connection between the second conductive line 636 and the corresponding data line 630 based on the signal delivered by the third conductive line 644. Each control unit 642, electrically connected to the third conductive line 644, the second conductive line 637 and one corresponding data line 630, is employed to control an electrical connection between the second conductive line 637 and the corresponding data line 630 based on the signal delivered by the third conductive line 644.

The first conductive lines 631~632 are employed to deliver a plurality of gate signals required for performing a panel test. The second conductive lines 635~637 are employed to deliver a plurality of test data signals. For that reason, the signal delivered by the third conductive line 644 is actually one of the gate signals delivered by the first conductive lines 631~632. In other words, the control units 640~642 control the electrical connections between the second conductive lines 635~637 and the data lines 630 based on one corresponding gate signal having high voltage level. Compared with the flat-panel display 300 shown in FIG. 2, the flat-panel display 600 includes only two first conductive lines 631~632 wiring in two opposite side areas of the bottom substrate 610. That is, the size of the flat-panel display 600 can be further reduced following an additional decrease of the two opposite side areas of the bottom substrate 610.

Figure 7:
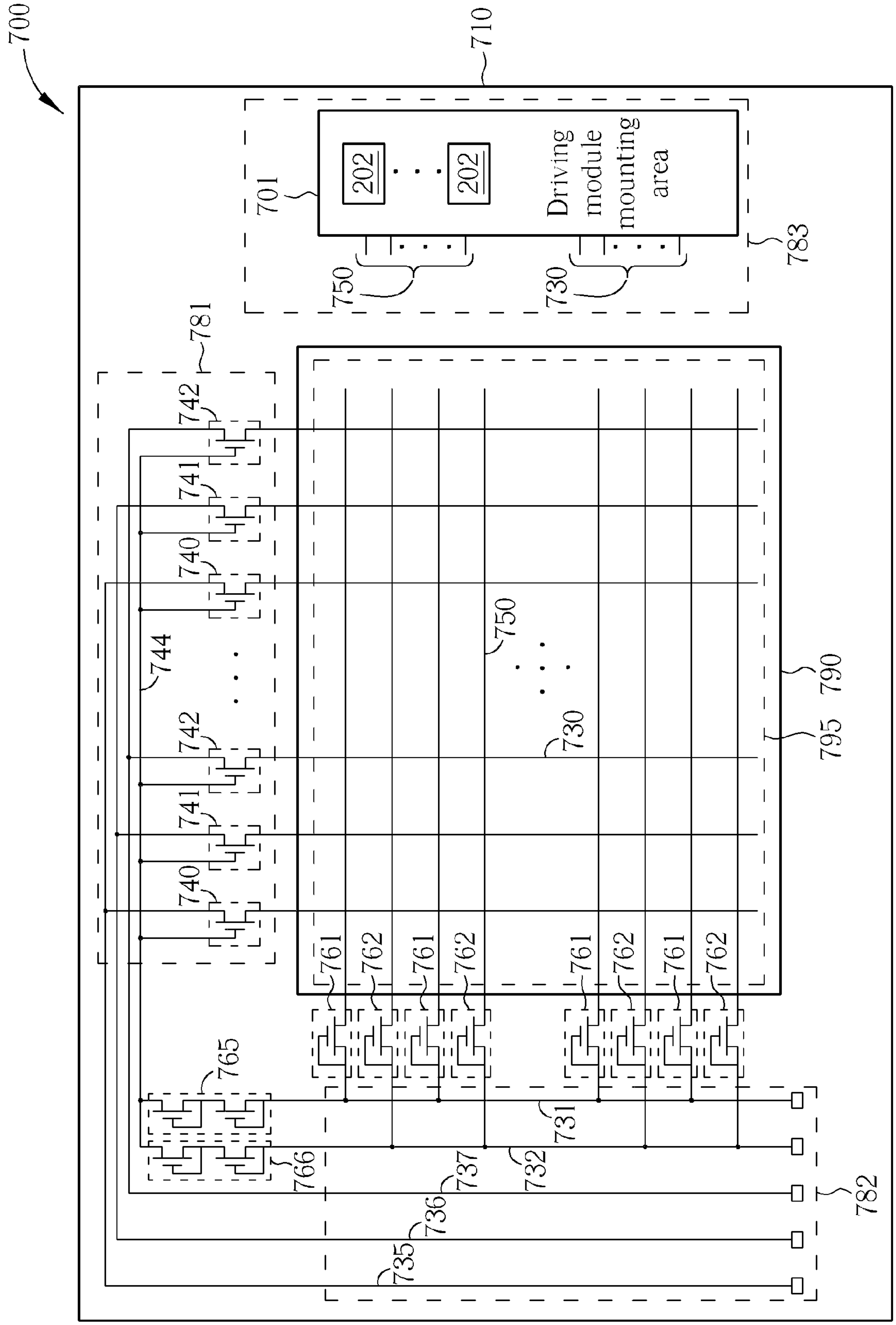
FIG. 7 is a schematic diagram showing the structure of a flat-panel display having test architecture in accordance with a seventh embodiment of the present invention.

FIG. 7 is a schematic diagram showing the structure of a flat-panel display having test architecture in accordance with a seventh embodiment of the present invention. As shown in FIG. 7, the flat-panel display 700 comprises a bottom substrate 710, a top substrate 790 positioned on top of the bottom substrate 710, and a liquid crystal layer (not shown) encapsulated between the bottom substrate 710 and the top substrate 790. The top substrate 790 is a color filter employed to display color images. The bottom substrate 710 comprises a plurality of data lines 730, a plurality of gate lines 750, a plurality of first conductive lines 731~732, a plurality of second conductive lines 735~737, a third conductive line 744, a plurality of first one-way switching units 761~762, a plurality of second one-way switching units 765~766, a plurality of control units 740~742, a first region 781, a second region 782, a third region 783, an image display area 795 and a driving module mounting area 701. The first region 781 and the second region 782 are disposed in two adjacent side areas external to the image display area 795. The third region 783 is disposed in another side area opposite to the side area including the second region 782.

The control units 740~742 and the third conductive line 744 are disposed in the first region 781. The first conductive lines 731~732 and the second conductive lines 735~737 are disposed in the second region 782. The driving module mounting area 701 is disposed in the third region 783. The driving module mounting area 701, electrically connected to the data lines 730 and the gate lines 750, is utilized for installing a driving module so as to provide data signals and gate signals required for displaying images. The internal structure of the driving module mounting area 701 is identical to that of the driving module mounting area 201 shown in FIG. 1.

Each first one-way switching unit 761, electrically connected between the first conductive line 731 and one corresponding odd gate line 750, functions to allow one-way signal transmission from the first conductive line 731 to the corresponding odd gate line 750. Each first one-way switching unit 762, electrically connected between the first conductive line 732 and one corresponding even gate line 750, functions to allow one-way signal transmission from the first conductive line 732 to the corresponding even gate line 750. As shown in FIG. 7, the odd gate lines 750 are electrically connected to the first one-way switching units 761 respectively, and the even gate lines 750 are electrically connected to the first one-way switching units 762 respectively. The internal structures of the first one-way switching units 761~762 are identical to those of the first one-way switching units 461~464 shown in FIG. 4.

The second one-way switching unit 765, electrically connected between the first conductive line 731 and the third conductive line 744, functions to allow one-way signal transmission from the first conductive line 731 to the third conductive line 744. The second one-way switching unit 766, electrically connected between the first conductive line 732 and the third conductive line 744, functions to allow one-way signal transmission from the first conductive line 732 to the third conductive line 744. The internal structures of the second one-way switching units 765~766 are identical to those of the second one-way switching units 365~368 shown in FIG. 3.

Each control unit 740, electrically connected to the third conductive line 744, the second conductive line 735 and one corresponding data line 730, is employed to control an electrical connection between the second conductive line 735 and the corresponding data line 730 based on the signal delivered by the third conductive line 744. Each control unit 741, electrically connected to the third conductive line 744, the second conductive line 736 and one corresponding data line 730, is employed to control an electrical connection between the second conductive line 736 and the corresponding data line 730 based on the signal delivered by the third conductive line 744. Each control unit 742, electrically connected to the third conductive line 744, the second conductive line 737 and one corresponding data line 730, is employed to control an electrical connection between the second conductive line 737 and the corresponding data line 730 based on the signal delivered by the third conductive line 744. The internal structures of the control units 740~742 are identical to those of the control units 240~242 shown in FIG. 1. Compared with the flat-panel display 600 shown in FIG. 6, the first conductive lines 731~732 and the second conductive lines 735~737 of the flat-panel display 700 are all disposed in same side area of the bottom substrate 710; furthermore, the driving module mounting area 701 and the control units 740~742 are disposed in two adjacent side areas of the bottom substrate 710.

To sum up, in comparison with the prior art, the gate signals used in the flat-panel display of the present invention are further employed to function as the control signal required for controlling the control units, and therefore the two opposite side areas of the bottom substrate are not required to dispose dedicated conductive lines for delivering the control signal. In other words, the size of the flat-panel display can be reduced significantly by a decrease of the two opposite side areas of the bottom substrate. For that reason, the flat-panel display of the present invention is particularly suitable for use as a small-size display installed in any portable electronic device.

The present invention is by no means limited to the embodiments as described above by referring to the accompanying drawings, which may be modified and altered in a variety of different ways without departing from the scope of the present invention. Thus, it should be understood by those skilled in the art that various modifications, combinations, sub-combinations and alternations might occur depending on design requirements and other factors insofar as they are within the scope of the appended claims or the equivalents thereof.

What is claimed is:

1. A flat-panel display comprising:

a substrate comprising an image display area and a border area;

a plurality of parallel data lines disposed in the image display area of the substrate;

a plurality of parallel gate lines disposed in the image display area of the substrate, the gate lines being substantially crossed with the data lines perpendicularly;

a plurality of first conductive lines, disposed in the border area of the substrate, for delivering a plurality of gate signals required for performing a panel test;

a plurality of first one-way switching units disposed in the border area of the substrate, each first one-way switching unit being electrically connected between a corresponding first conductive line and a corresponding gate line, the first one-way switching unit operating to allow one-way signal transmission from the corresponding first conductive line to the corresponding gate line;

a plurality of second conductive lines, disposed in the border area of the substrate, for delivering a plurality of test data signals;

a third conductive line, disposed in the border area of the substrate, for delivering a gate signal of the gate signals;

a plurality of second one-way switching units disposed in the border area of the substrate, each second one-way switching unit being electrically connected between the third conductive line and a corresponding first conductive line, the second one-way switching unit operating to allow one-way signal transmission from the corresponding first conductive line to the third conductive line; and a plurality of control units disposed in the border area of the substrate, each control unit being employed to control an electrical connection between a corresponding second conductive line and a corresponding data line based on the gate signal delivered by the third conductive line.

2. The flat-panel display of claim 1, wherein a plurality of odd gate lines of the gate lines are electrically connected to two corresponding first conductive lines of the first conductive lines based on an interlace arrangement.

3. The flat-panel display of claim 1, wherein a plurality of odd gate lines of the gate lines are electrically connected to a corresponding first conductive line of the first conductive lines.

4. The flat-panel display of claim 1, wherein a plurality of even gate lines of the gate lines are electrically connected to two corresponding first conductive lines of the first conductive lines based on an interlace arrangement.

5. The flat-panel display of claim 1, wherein a plurality of even gate lines of the gate lines are electrically connected to a corresponding first conductive line of the first conductive lines.

6. The flat-panel display of claim 1, wherein the gate lines comprise odd gate lines and even gate lines electrically connected respectively to two different first conductive lines of the first conductive lines based on an interlace arrangement.

7. The flat-panel display of claim 1, wherein the first one-way switching unit comprises a diode, the diode comprising:

a positive end electrically connected to the corresponding first conductive line; and a negative end electrically connected to the corresponding gate line.

8. The flat-panel display of claim 1, wherein the first one-way switching unit comprises a transistor, the transistor comprising:

a first end electrically connected to the corresponding first conductive line;

a second end electrically connected to the corresponding gate line; and a gate end electrically connected to the first end.

9. The flat-panel display of claim 8, wherein the transistor is a thin film transistor, a metal oxide semiconductor (MOS) field effect transistor, or a junction field effect transistor.

10. The flat-panel display of claim 1, wherein the second one-way switching unit comprises a first diode, the first diode comprising:

a positive end electrically connected to the corresponding first conductive line; and a negative end electrically connected to the third conductive line.

11. The flat-panel display of claim 10, wherein the second one-way switching unit further comprises a second diode, the second diode comprising:

a positive end electrically connected to the corresponding first conductive line; and a negative end electrically connected to the positive end of the first diode.

12. The flat-panel display of claim 1, wherein the second one-way switching unit comprises a first transistor, the first transistor comprising:

a first end electrically connected to the corresponding first conductive line;

a second end electrically connected to the third conductive line; and a gate end electrically connected to the first end.

13. The flat-panel display of claim 12, wherein the second one-way switching unit further comprises a second transistor, the second transistor comprising:

a first end electrically connected to the corresponding first conductive line;

a second end electrically connected to the first end of the first transistor; and a gate end electrically connected to the first end of the second transistor.

14. The flat-panel display of claim 13, wherein the first transistor and the second transistor are thin film transistors, MOS field effect transistors, or junction field effect transistors.

15. The flat-panel display of claim 1, wherein the control unit comprises a transistor, the transistor comprising:

a first end electrically connected to the corresponding second conductive line;

a second end electrically connected to the corresponding data line; and a gate end electrically connected to the third conductive line.

16. The flat-panel display of claim 15, wherein the transistor is a thin film transistor, a MOS field effect transistor, or a junction field effect transistor.

17. The flat-panel display of claim 1, further comprising:

a driving module mounting area electrically connected to the data lines and the gate lines, the driving module mounting area including at least one driver mounting area.

18. The flat-panel display of claim 17, wherein the border area includes a first region and a second region, the control units are disposed in the first region, and the driving module mounting area is disposed in the second region.

19. The flat-panel display of claim 1, further comprising:

a source driving module mounting area electrically connected to the data lines, the source driving module mounting area including at least one source driver mounting area; and a gate driving module mounting area electrically connected to the gate lines, the gate driving module mounting area including at least one gate driver mounting area.

20. The flat-panel display of claim 19, wherein the border area includes a first region and a second region, the control units are disposed in the first region, and the source driving module mounting area and the gate driving module mounting area are disposed in the second region.

21. The flat-panel display of claim 19, wherein the border area includes a first region, a second region and a third region, the control units are disposed in the first region, the source driving module mounting area is disposed in the second region, and the gate driving module mounting area is disposed in the third region.

* * * * *